(12) United States Patent
Kim

(10) Patent No.: US 10,535,918 B2
(45) Date of Patent: Jan. 14, 2020

(54) UNIFIED ANTENNA MODULE AND ROOF ANTENNA FOR VEHICLE USING THE SAME

(71) Applicants: Hyundai Motor Company, Seoul (KR); Kia Motors Corporation, Seoul (KR)

(72) Inventor: Byung Guk Kim, Seongnam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 192 days.

(21) Appl. No.: 15/702,205

(22) Filed: Sep. 12, 2017

(65) Prior Publication Data

US 2018/0269567 A1   Sep. 20, 2018

(30) Foreign Application Priority Data

Mar. 16, 2017   (KR) .......................... 10-2017-0033230

(51) Int. Cl.
| | |
|---|---|
| H01Q 1/32 | (2006.01) |
| H03F 3/19 | (2006.01) |
| H04B 1/44 | (2006.01) |
| H04B 1/3822 | (2015.01) |
| H03F 3/72 | (2006.01) |
| H01Q 1/24 | (2006.01) |
| H01Q 1/12 | (2006.01) |

(52) U.S. Cl.
CPC ............ *H01Q 1/3275* (2013.01); *H03F 3/19* (2013.01); *H03F 3/72* (2013.01); *H04B 1/3822* (2013.01); *H04B 1/44* (2013.01); *H01Q 1/1214* (2013.01); *H01Q 1/24* (2013.01); *H03F 2200/451* (2013.01); *H03F 2203/7236* (2013.01)

(58) Field of Classification Search
CPC ..................................................... H04B 1/3822
See application file for complete search history.

(56) References Cited

U.S. PATENT DOCUMENTS

| | | | | |
|---|---|---|---|---|
| 3,716,727 | A * | 2/1973 | Stehlin ................ | H03F 3/45479 327/378 |
| 6,002,920 | A * | 12/1999 | Consolazio ............ | H04B 1/005 333/101 |
| 2013/0265111 | A1* | 10/2013 | Ota ........................ | H03F 1/0277 330/286 |
| 2018/0261913 | A1* | 9/2018 | Imamura ................ | H01Q 5/335 |

FOREIGN PATENT DOCUMENTS

KR   1020150122475 A   11/2015

* cited by examiner

*Primary Examiner* — Hsinchun Liao
(74) *Attorney, Agent, or Firm* — Slater Matsil, LLP

(57) ABSTRACT

A unified antenna module includes an antenna, a first preamplifier configured to be connectable to an RF cable, and a second preamplifier configured to be connectable to a transmitter/receiver module. A switch part is configured to connect the antenna with the first preamplifier or the second preamplifier when one of the RF cable and the transmitter/receiver module is connected.

21 Claims, 4 Drawing Sheets

UNIFIED ANTENNA MODULE AND ROOF ANTENNA FOR VEHICLE USING THE SAME

CROSS-REFERENCE TO RELATED APPLICATIONS

This application claims priority to and the benefit of Korean Patent Application No. 10-2017-0033230, filed on Mar. 16, 2017, the disclosure of which is incorporated herein by reference in its entirety.

TECHNICAL FIELD

The present invention relates to an antenna, for example, for a vehicle.

BACKGROUND

As a penetration rate of automobiles increases and communication and multimedia technologies develop rapidly, a head unit, i.e., Audio Video Navigation (AVN) which may integrally use MP3, video, DMB, navigation, telematics and the like as well as existing AM/FM radio is recently installed in a vehicle.

In order to receive these services through the AVN in the vehicle, a roof antenna which is a unified antenna for wireless communication should be installed on a roof panel of the vehicle. The roof antenna may be roughly classified into a shark fin shape and a micro pole shape according to an external appearance thereof.

Also, as illustrated in FIG. 1, the roof antenna can be divided into a transmitter/receiver module separation type as shown in FIG. 1A and a transmitter/receiver module integration type according on whether a transmitter/receiver module and an antenna are coupled as shown in FIG. 1B.

First, in a transmitter/receiver module separation type roof antenna 1A, an antenna 11 is installed on a roof panel 10, and a transmitter/receiver module 14 is included in a head unit 13 inside a vehicle. The antenna 11 and the transmitter/receiver module 14 are connected to each other through a plurality of RF cables 12 to transmit and receive a signal.

In a transmitter/receiver module integration type roof antenna 1B, an antenna 11 is installed on a roof panel 10, and a transmitter/receiver module 14 is directly connected to the antenna 11 at a lower portion of the roof panel 10. At this time, a module in which the antenna 11 and the transmitter/receiver module 14 are combined is connected to a head unit 13 through an Ethernet cable 17.

Meanwhile, as illustrated in FIG. 2, in the transmitter/receiver module separation type roof antenna 1A, signal attenuation occurs by the plurality of long RF cables 12, and a preamplifier 15 having a higher gain should be installed at the antenna. And in the transmitter/receiver module integration type roof antenna 1B, since the transmitter/receiver module 14 is disposed adjacently, a preamplifier 16 having a relatively low gain is installed at the antenna.

As described above, since the roof antenna has different signal attenuation and impedance according to the above-described transmitter/receiver module separation type and transmitter/receiver module integration type, the antenna should be separately manufactured to have different preamplifiers, and thus an installation process thereof is inconvenient, and also cost of development and maintenance is increased.

SUMMARY

Embodiments of the present invention relates to an antenna for a vehicle, and in particular examples, to a unified antenna module that is capable of coping with a change in a shape of a roof antenna for a vehicle.

Embodiments of the present invention are directed to a unified antenna module which is capable of being commonly used regardless of a type of a roof antenna such as a transmitter/receiver module separation type and a transmitter/receiver module integration type, and a roof antenna for a vehicle using the same.

According to an aspect of the present invention, a unified antenna module includes an antenna. A first preamplifier is configured to be connectable to an RF cable and a second preamplifier is configured to be connectable to a transmitter/receiver module. A switch part is configured to connect the antenna with the first preamplifier or the second preamplifier when one of the RF cable and the transmitter/receiver module is connected.

The switch part may include a first switch part which is disposed to connect each of one end of the first preamplifier and one end of the second preamplifier with the antenna; a second switch part which is disposed to connect each of the other end of the first preamplifier and the other end of the second preamplifier with the RF cable or the transmitter/receiver module; and a switch controller which electrically connects the first switch part and the second switch part and has an identification terminal connected to the transmitter/receiver module.

When the RF cable is connected, the switch controller may control the first switch part and the second switch part so that the first preamplifier is connected and the second preamplifier is disconnected.

When the transmitter/receiver module is connected, the switch controller may control the first switch part and the second switch part so that the second preamplifier is connected and the first preamplifier is disconnected.

Each of the first switch part and the second switch part may include a single pole double throw (SPDT) RF switch.

The transmitter/receiver module may further include an ID pin which is connected to the identification terminal, and the switch controller may control the first switch part and the second switch part when being connected to the ID pin.

The switch controller may further include a buffer which has a first input terminal; an inverter which has a second input terminal connected to the first input terminal; a third switch which is connected between the identification terminal and a connection node of the first input terminal and the second input terminal to be closed when the ID pin of the transmitter/receiver module is connected to the identification terminal and to be opened when the connection is released; and a resistor which is connected between an internal power source and the connection node of the first input terminal and the second input terminal.

The buffer and the inverter may be connected to output a signal to the first switch part and the second switch part.

The buffer may output a first signal V1, and the inverter may output a second signal V2, and the third switch may be switched on the basis of the first signal V1 and the second signal V2.

The third switch may be opened when the first signal V1 is a high signal H and the second signal V2 is a low signal L.

The third switch may be closed when the first signal V1 is the low signal L and the second signal V2 is the high signal H.

The switch controller may further include a buffer which has a first input terminal; an inverter which has a second input terminal connected to the first input terminal; and a resistor which is connected between an internal power source and a connection node of the first input terminal and the second input terminal, and the identification terminal may be connected to the connection node of the first input terminal and the second input terminal.

The buffer may output a first signal V1, and the inverter may output a second signal V2, and the third switch may be switched on the basis of the first signal V1 and the second signal V2.

The first switch part may be closed and the second switch part may be opened when the first signal V1 is a high signal H and the second signal V2 is a low signal L.

The first switch part may be opened and the second switch part may be closed when the first signal V1 is the low signal L and the second signal V2 is the high signal H.

According to another aspect of the present invention, a unified antenna module includes an antenna, a first preamplifier, and a second preamplifier that has a gain different from that of the first preamplifier. A first switch part is disposed to connect each of one end of the first preamplifier and one end of the second preamplifier with the antenna and a second switch part is disposed to connect each of the other end of the first preamplifier and the other end of the second preamplifier with a RF cable or a transmitter/receiver module. A switch controller is electrically connected to the first switch part and the second switch part and has an identification terminal connected to an ID pin transmitter/receiver module. In the switch controller, the first switch part and the second switch part connect the antenna and the first preamplifier when the RF cable is connected to the second switch part, and the first switch part and the second switch part connect the antenna and the second preamplifier when the ID pin of the transmitter/receiver module is connected to the identification terminal.

The switch controller may further include a buffer which has a first input terminal; an inverter which has a second input terminal connected to the first input terminal; and a resistor which is connected between an internal power source and a connection node of the first input terminal and the second input terminal, and the ID pin may be connected to the connection node of the first input terminal and the second input terminal.

The buffer may output a first signal V1, and the inverter may output a second signal V2, and the third switch may be switched on the basis of the first signal V1 and the second signal V2.

The third switch may be opened when the first signal V1 is a high signal H and the second signal V2 is a low signal L.

The third switch may be closed when the first signal V1 is the low signal L and the second signal V2 is the high signal H.

According to still another aspect of the present invention, there is provided a roof antenna for a vehicle, including a roof panel; a transmitter/receiver module installed at a head unit; a RF cable connected to the transmitter/receiver module; and any one of the unified antenna modules described above installed at the roof panel and coupled to the RF cable.

According to yet another aspect of the present invention, there is provided a roof antenna for a vehicle, including a roof panel; a transmitter/receiver module; an Ethernet cable connected to the transmitter/receiver module and a head unit; and any one of the unified antenna modules described above installed at the roof panel and integrally coupled to the transmitter/receiver module.

BRIEF DESCRIPTION OF THE DRAWINGS

The above and other features and advantages of the present invention will become more apparent to those of ordinary skill in the art by describing in detail exemplary embodiments thereof with reference to the accompanying drawings, in which:

FIG. 1, which includes

FIG. 2, which includes

DETAILED DESCRIPTION OF ILLUSTRATIVE EMBODIMENTS

Figure 1A:
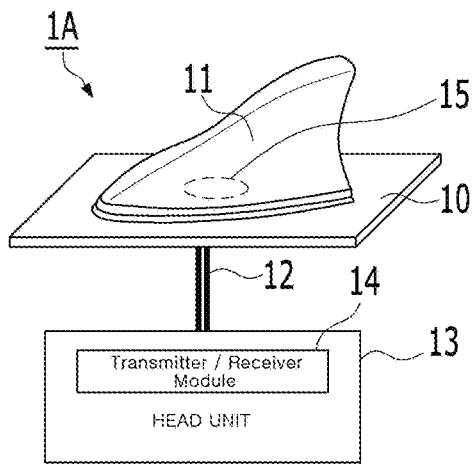
FIGS. 1A and 1B, is a block diagram illustrating a general configuration of each of (FIG. 1A) a transmitter/receiver module separation type antenna and (FIG. 1B) a transmitter/receiver module integration type antenna.

Hereinafter, exemplary embodiments will be described in detail below with reference to the accompanying drawings.

In the drawings, some constitution components are exaggerated, omitted or schematically shown for convenience and clarity of explanation. Further, the size of respective components does not reflect entirely the actual size. Also, like reference numerals refer to like or corresponding elements throughout the drawings.

Figure 3:
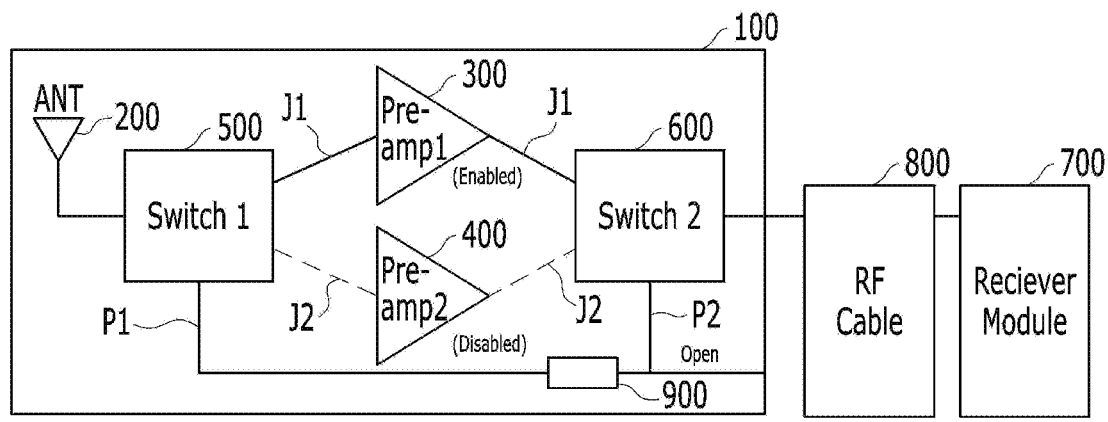
FIG. 3 is a view illustrating a configuration and a connection relationship of a transmitter/receiver module separation type antenna in which a unified antenna module according to one embodiment of the present invention is installed.
Figure 4:
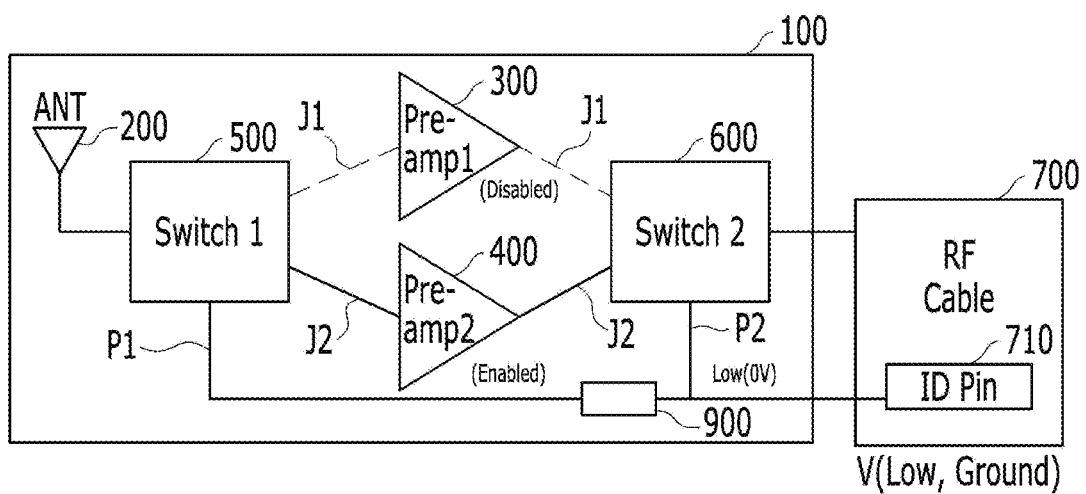
FIG. 4 is a view illustrating a configuration and a connection relationship of a transmitter/receiver module integration type antenna in which the unified antenna module according to one embodiment of the present invention is installed.
Figure 5:
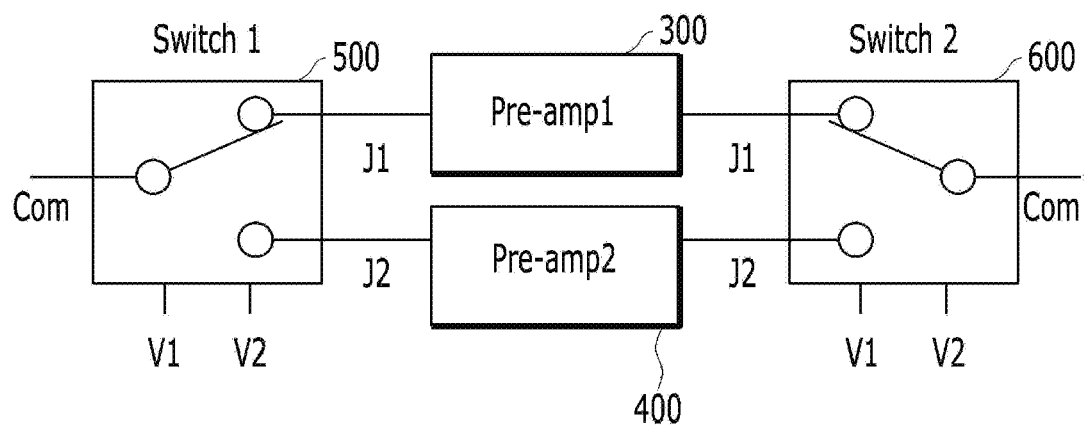
FIG. 5 is a view illustrating an analog switch method in the unified antenna module according to the embodiment.
Figure 6:
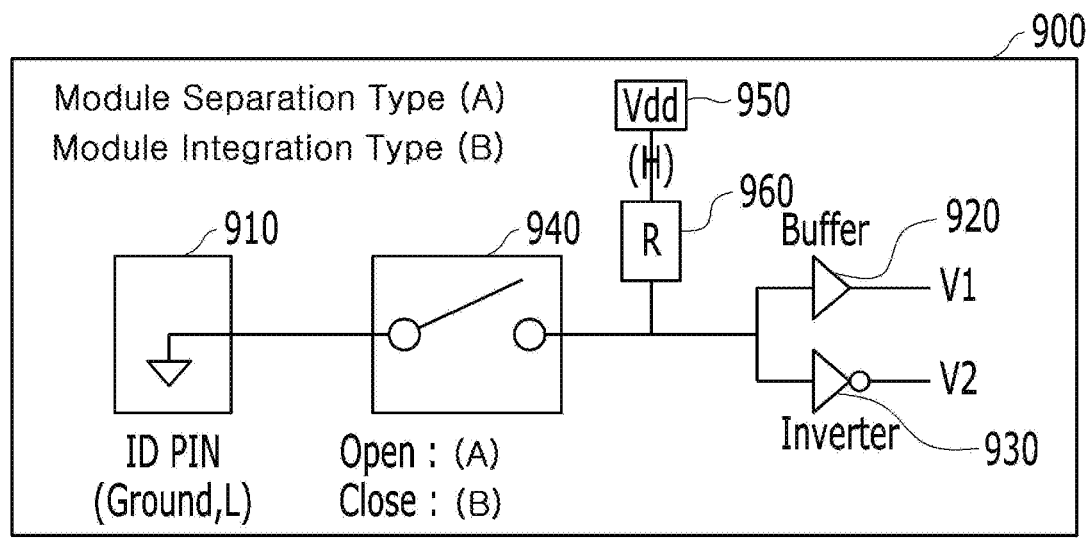
FIG. 6 illustrates a digital switch method in the unified antenna module according to the embodiment.

FIG. 3 is a view illustrating a configuration and a connection relationship of a transmitter/receiver module separation type antenna in which a unified antenna module according to one embodiment of the present invention is installed, FIG. 4 is a view illustrating a configuration and a connection relationship of a transmitter/receiver module integration type antenna in which the unified antenna module according to one embodiment of the present invention is installed, FIG. 5 is a view illustrating an analog switch method in the unified antenna module according to the embodiment, and FIG. 6 illustrates a digital switch method in the unified antenna module according to the embodiment.

Figure 1B:
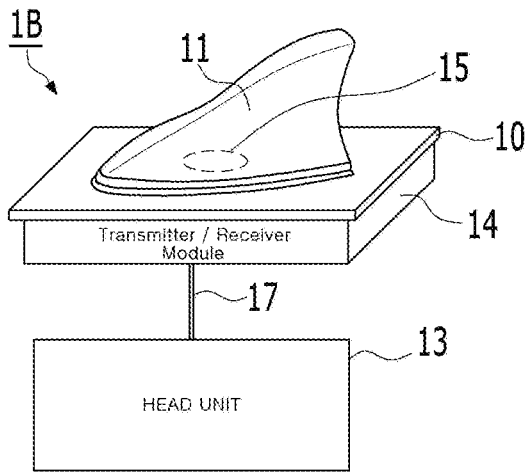
Figure 2A:
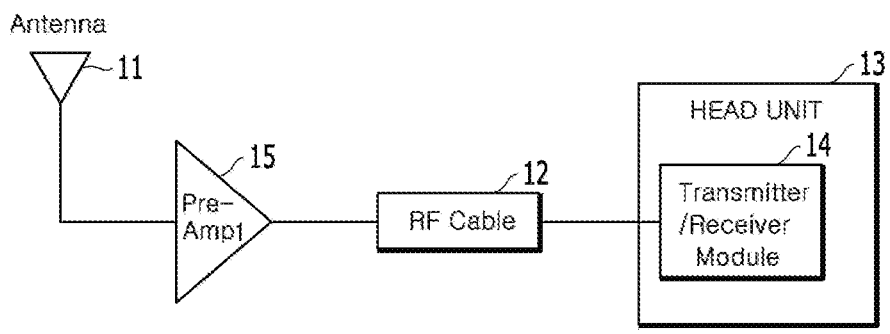
FIGS. 2A and 2B, illustrates a connection relationship among main elements of FIG. 1.
Figure 2B:
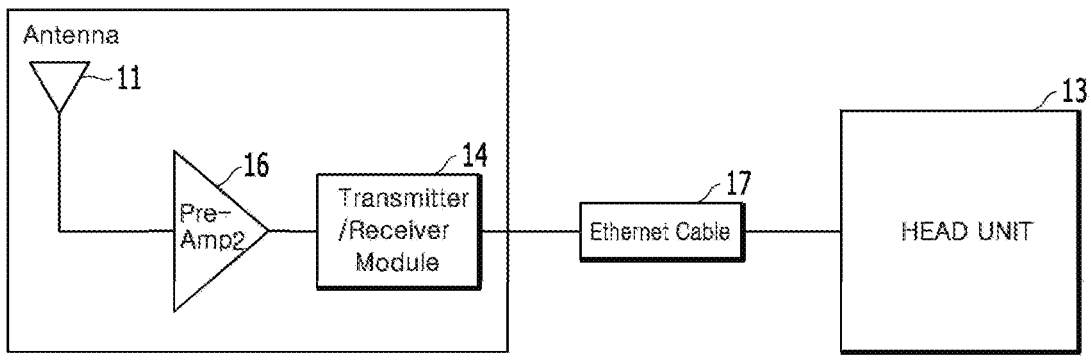

As illustrated in FIGS. 3 and 4, a unified antenna module 100 according to an embodiment may include an antenna 200, a first preamplifier 300, a second preamplifier 400 and a switch part. The unified antenna module 100 may provide a modular antenna including the preamplifiers 300 and 400 to be commonly used in a transmitter/receiver module separation type roof antenna 1A (referring to FIG. 1A) and a transmitter/receiver module integration type roof antenna 1B (referring to FIG. 1B).

The antenna 200 may be installed on a roof panel of a vehicle while being installed inside a shark fin- or micro pole-shaped housing and may transmit and receive a wireless signal.

The first preamplifier 300 and the second preamplifier 400 may amplify a signal received from the antenna 200.

The first preamplifier 300 may have a gain which is suitable for the transmitter/receiver module separation type. Therefore, the first preamplifier 300 may be formed to be connectable to an RF cable 800 which is a cable of the transmitter/receiver module separation type.

The second preamplifier 400 may have a gain which is suitable for the transmitter/receiver module integration type. Therefore, the second preamplifier 400 may have the gain lower than that of the first preamplifier 300 and may be connected close to a transmitter/receiver module integration type transmitter/receiver module 700.

The switch part connects the first preamplifier 300 or the second preamplifier 400 with the antenna 200 when one of the RF cable 800 and the transmitter/receiver module 700 is connected.

Therefore, since the antenna 200 may be selectively connected to the first preamplifier 300 or the second preamplifier 400 by control of the switch part, the unified antenna module 100 of the embodiment may be commonly used to the transmitter/receiver module separation type and the transmitter/receiver module integration type.

More specifically, the switch part may include a first switch part 500, a second switch part 600 and a switch controller 900.

The first switch part 500 may be disposed to connect each of one end of the first preamplifier 300 and one end of the second preamplifier 400 with the antenna 200. The second switch part 600 may be disposed to connect each of the other end of the first preamplifier 300 and the other end of the second preamplifier 400 with the RF cable 800 or the transmitter/receiver module 700.

That is, the first switch part 500 is located between the antenna 200 and the preamplifiers 300 and 400, and the second switch part 600 is disposed between the preamplifiers 300 and 400 and the RF cable 800 or the transmitter/receiver module 700.

Here, as illustrated in FIG. 5, each of the first switch part 500 and the second switch part 600 may include a single pole double throw (SPDT) RF switch. The SPDT switch is a switch which may open and close two lines with one pole. Therefore, as illustrated in FIGS. 3 and 4, a first line J1 to which the first preamplifier 300 is connected and a second line J2 to which the second preamplifier 400 is connected may be selectively opened and closed by the first switch part 500 and the second switch part 600.

The switch controller 900 may electrically connect the first switch part 500 and the second switch part 600 and may have an identification terminal 910 which is coupled to the transmitter/receiver module 700, as illustrated in FIG. 6. And as illustrated in FIG. 4, the switch controller 900 has third lines P1 and P2 which electrically connect the first switch part 500, the second switch part 600 and the identification terminal 910.

As illustrated in FIG. 3, when the transmitter/receiver module separation type RF cable 800 is connected to the unified antenna module 100, the switch controller 900 controls opening and closing of the first switch part 500 and the second switch part 600, connects the first preamplifier 300 and disconnects the second preamplifier 400. That is, the switch controller 900 connects the first line J1 and allows the second line J2 to be opened.

As illustrated in FIG. 4, when the transmitter/receiver module integration type transmitter/receiver module 700 is connected to the unified antenna module 100, the switch controller 900 may control the opening and closing of the first switch part 500 and the second switch part 600 to connect the second preamplifier 400 and to disconnect the first preamplifier 300. The switch controller 900 opens the first line J1 and allows the second line J2 to be connected.

In this case, in order for the switch controller 900 to automatically control the first switch part 500 and the second switch part 600, the transmitter/receiver module 700 may further include an identification (ID) pin 710 which is connected to the above-described identification terminal 910.

When the identification terminal 910 and the ID pin 710 are connected, the switch controller 900 may automatically control the first switch part 500 and the second switch part 600 and may connect the second preamplifier 400 and the antenna 200. Also, when the connection of the identification terminal 910 and the ID pin 710 is released, the switch controller 900 may automatically control the first switch part 500 and the second switch part 600 and may connect the first preamplifier 300 and the antenna 200.

As illustrated in FIG. 6, to enable the above-described control, the switch controller 900 may further include a buffer 920, an inverter 930, a third switch 940, internal power source (Vdd) 950 and a resistor 960.

The buffer 920 may have a first input terminal which receives a voltage signal generated from the internal power source 950 and may output a first signal V1 required for control. As illustrated in FIG. 5, the first signal V1 may be transmitted to the first switch part 500 and the second switch part 600.

The inverter 930 may have a second input terminal which is connected to the first input terminal to receive a voltage signal and may output a second signal V2 required for control. The second signal V2 may be transmitted to the first switch part 500 and the second switch part 600.

That is, the buffer 920 and the inverter 930 may be connected to the third lines P1 and P2 illustrated in FIGS. 3 and 4 to output the signal to the first switch part 500 and the second switch part 600.

The resistor 960 is connected between the internal power source 950 and a connection node of the first input terminal and the second input terminal. That is, when the voltage signal is applied from the internal power source 950, the buffer 920 and the inverter 930 may output a proper intensity of the first signal V1 and the second signal V2 through the resistor 960.

The third switch 940 is connected between the identification terminal 910 and the connection node of the first input terminal of the buffer 920 and the second input terminal of the inverter 930. The third switch 940 may be operated to be closed when the ID pin 710 of the transmitter/receiver module 700 is connected and to be opened when the connection is released.

The third switch 940 may be switched on the basis of the first signal V1 and the second signal V2. That is, when the first signal V1 is a high signal H and the second signal V2 is a low signal L, the third switch 940 may be opened.

And when the first signal V1 is the low signal L and the second signal V2 is the high signal H, the third switch 940 may be closed.

The control by the switch controller 900 having the above-described configuration may be implemented as follows.

Referring to Truth Table of FIG. 6, while the identification terminal 910 is not connected to the ID pin 710, the switch controller 900 determines that it is the transmitter/receiver module separation type and opens the third switch 940. At this time, the first signal V1 which is a control signal for controlling the third switch 940 becomes the high signal H, and the second signal V2 becomes the low signal L, and the first signal V1 and the second signal V2 are transmitted to the first switch part 500 and the second switch part 600, as illustrated in FIG. 5.

In this case, as indicated in Truth Table of FIG. 5, the first line J1 is connected, and the second line J2 is disconnected, and thus the antenna 200 and the first preamplifier 300 may be connected, as illustrated in FIG. 3.

Meanwhile, referring to Truth Table of FIG. 6, while the identification terminal 910 is connected to the ID pin 710, the switch controller 900 determines that it is the transmitter/receiver module integration type and connects the third switch 940. At this time, the first signal V1 is converted into the low signal L, and the second signal V2 is converted into the high signal H, and the first signal V1 and the second signal V2 are transmitted to the first switch part 500 and the second switch part 600, as illustrated in FIG. 5.

Even in this case, as indicated in Truth Table of FIG. 5, the second line J2 is connected, and the first line J1 is disconnected, and thus the antenna 200 and the second preamplifier 400 may be connected, as illustrated in FIG. 4.

In addition to the above-described configuration, the switch controller 900 may not include the third switch 940 which is opened and closed, and the identification terminal 910 itself may serve as a switch. That is, the switch controller 900 may control the first switch part 500 and the second switch part 600 through the first signal V1 and the second signal V2 so that a state in which the antenna 200 and the first preamplifier 300 are connected by default is maintained when the ID pin 710 is not connected to the identification terminal 910 and the antenna 200 and the second preamplifier 400 are connected only when the ID pin 710 is connected to the identification terminal 910.

The unified antenna module according to the above-described embodiments may be applied to various types of antennas for a vehicle installed at a roof panel, such as the transmitter/receiver module integration type or separation type.

According to the unified antenna module and the roof antenna for a vehicle using the same of the present invention, the roof antenna for a vehicle can be easily manufactured and installed through the antenna module which can be commonly used regardless of the type of the roof antenna such as the transmitter/receiver module separation type and the transmitter/receiver module integration type, and the cost of development and maintenance and resource waste can be minimized.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a variation are included in the scope of the present invention.

What is claimed is:

1. A unified antenna module comprising:
    an antenna;
    a first preamplifier configured to be connectable to an RF cable;
    a second preamplifier configured to be connectable to a transmitter/receiver module; and
    a switch part configured to connect the antenna with the first preamplifier or the second preamplifier when one of the RF cable and the transmitter/receiver module is connected, wherein the switch part comprises:
    a first switch part disposed to connect each of one end of the first preamplifier and one end of the second preamplifier with the antenna;
    a second switch part disposed to connect each of an other end of the first preamplifier and an other end of the second preamplifier with the RF cable or the transmitter/receiver module; and
    a switch controller electrically connecting the first switch part and the second switch part, the switch controller having an identification terminal connected to the transmitter/receiver module.

2. The unified antenna module of claim 1, wherein the switch controller is configured to control the first switch part and the second switch part so that the first preamplifier is connected and the second preamplifier is disconnected when the RF cable is connected.

3. The unified antenna module of claim 2, wherein, the switch controller is configured to control the first switch part and the second switch part so that the second preamplifier is connected and the first preamplifier is disconnected when the transmitter/receiver module is connected.

4. The unified antenna module of claim 3, wherein the first switch part comprises a first single pole double throw RF switch and wherein the second switch part comprises a second single pole double throw RF switch.

5. The unified antenna module of claim 3, wherein the transmitter/receiver module further includes an ID pin connected to the identification terminal, and wherein the switch controller is to configured control the first switch part and the second switch part when being connected to the ID pin.

6. The unified antenna module of claim 5, wherein the switch controller further comprises:
    a buffer having a first input terminal;
    an inverter having a second input terminal connected to the first input terminal;
    a third switch connected between the identification terminal and a connection node of the first input terminal the second input terminal, wherein the third switch is to be closed when the ID pin of the transmitter/receiver module is connected to the identification terminal and to be opened when the ID pin of the transmitter/receiver module is not connected to the identification terminal; and
    a resistor connected between an internal power source and the connection node of the first input terminal and the second input terminal.

7. The unified antenna module of claim 6, wherein the buffer and the inverter are connected to output a signal to the first switch part and the second switch part.

8. The unified antenna module of claim 7, wherein the buffer is configured to output a first signal, and the inverter is configured to output a second signal, and the third switch is configured to be switched on the basis of the first signal and the second signal.

9. The unified antenna module of claim 8, wherein the third switch is configured to be opened when the first signal is a high signal and the second signal is a low signal.

10. The unified antenna module of claim 9, wherein the third switch is configured to be closed when the first signal is the low signal and the second signal is the high signal.

11. The unified antenna module of claim 5, wherein the switch controller further comprises:
a buffer having a first input terminal;
an inverter having a second input terminal connected to the first input terminal; and
a resistor connected between an internal power source and a connection node of the first input terminal and the second input terminal, wherein the identification terminal is connected to the connection node of the first input terminal and the second input terminal.

12. The unified antenna module of claim 11, wherein the buffer is configured to output a first signal, the inverter is configured to output a second signal, and the first and second switch parts are configured to be switched on the basis of the first signal and the second signal.

13. The unified antenna module of claim 12, wherein the first switch part is configured to be closed and the second switch part is opened when the first signal is a high signal and the second signal is a low signal.

14. The unified antenna module of claim 13, wherein the first switch part is configured to be opened and the second switch part is closed when the first signal is the low signal and the second signal is the high signal.

15. A roof antenna for a vehicle, comprising:
a roof panel;
a transmitter/receiver module installed at a head unit;
a RF cable connected to the transmitter/receiver module; and
the unified antenna module of claim 1 installed at the roof panel and coupled to the RF cable.

16. A roof antenna for a vehicle, comprising:
a roof panel;
a transmitter/receiver module;
an Ethernet cable connected to the transmitter/receiver module and a head unit; and
the unified antenna module of claim 1 installed at the roof panel and integrally coupled to the transmitter/receiver module.

17. A unified antenna module comprising:
an antenna;
a first preamplifier having a first gain;
a second preamplifier having a second gain different from the first gain;
a first switch part disposed to connect each of one end of the first preamplifier and one end of the second preamplifier with the antenna;
a second switch part disposed to connect each of an other end of the first preamplifier and the other end of the second preamplifier with a RF cable or a transmitter/receiver module; and
a switch controller electrically connected to the first switch part and the second switch part and having an identification terminal connected to an ID pin of the transmitter/receiver module, wherein the switch controller is configured to control the first switch part and the second switch part to connect the antenna and the first preamplifier when the RF cable is connected to the second switch part, and to control the first switch part and the second switch part to connect the antenna and the second preamplifier when the ID pin of the transmitter/receiver module is connected to the identification terminal.

18. The unified antenna module of claim 17, wherein the switch controller further comprises:
a buffer having a first input terminal;
an inverter having a second input terminal connected to the first input terminal; and
a resistor connected between an internal power source and a connection node of the first input terminal and the second input terminal, wherein the ID pin is coupled to the connection node of the first input terminal and the second input terminal.

19. The unified antenna module of claim 18, wherein the ID pin is coupled to the connection node of the first input terminal and the second input terminal through a third switch, and wherein the buffer is configured to output a first signal, the inverter is configured to output a second signal, and the third switch is configured to be switched on the basis of the first signal and the second signal.

20. The unified antenna module of claim 19, wherein the third switch is configured to be opened when the first signal is a high signal and the second signal is a low signal.

21. The unified antenna module of claim 20, wherein the third switch is configured to be closed when the first signal is the low signal and the second signal is the high signal.

* * * * *